United States Patent [19]

Sarin

[11] Patent Number: 5,118,286
[45] Date of Patent: Jun. 2, 1992

[54] CLOSED LOOP METHOD AND APPARATUS FOR PREVENTING EXHAUSTED REACTANT GAS FROM MIXING WITH AMBIENT AIR AND ENHANCING REPEATABILITY OF REACTION GAS RESULTS ON WAFERS

[75] Inventor: Michael C. Sarin, Phoenix, Ariz.

[73] Assignee: Amtech Systems, Tempe, Ariz.

[21] Appl. No.: 642,536

[22] Filed: Jan. 17, 1991

[51] Int. Cl.⁵ .............................................. F27D 19/00
[52] U.S. Cl. .......................................... 432/2; 432/5; 432/11; 432/41; 432/57; 432/253
[58] Field of Search ................... 432/2, 37, 41, 47, 57, 432/5, 6, 11, 152, 253

[56] References Cited

U.S. PATENT DOCUMENTS

| | | | |
|---|---|---|---|
| 4,351,805 | 9/1982 | Reisman et al. | 432/253 |
| 4,955,808 | 9/1990 | Miyagawa | 432/253 |
| 4,992,044 | 2/1991 | Philipossian | 432/253 |

*Primary Examiner*—Henry C. Yuen

[57] ABSTRACT

Mixing of spent reactant gases with ambient air inside a semiconductor wafer fabrication facility is avoided and consequently corrosion of a scavenger box in a wafer fabrication facility is avoided. Repeatability of reaction gas results on wafers in a process tube is improved by maintaining precisely constant pressure in the wafer processing tube, which is operated close to ambient atmospheric pressure. This is accomplished by positioning an exhaust tube downstream from the wafers in the processing tube at a location that results in a uniform, repeatable reaction gas flow pattern between the wafers. Pressures at or near that point are measured by a differential manometer referenced to ambient atmospheric pressure to produce a pressure-indicating signal. The pressure indicating signal is electronically compared with a preset constant signal representative of the desired constant pressure at the pressure measurement point to produce an error signal. The error signal is used to continuously vary the position of an exhaust valve in the exhaust tube and thereby maintain the measured pressure constant despite variations in ambient atmospheric pressure and variations in an exhaust gas scrubber system coupled to the exhaust tube.

9 Claims, 1 Drawing Sheet

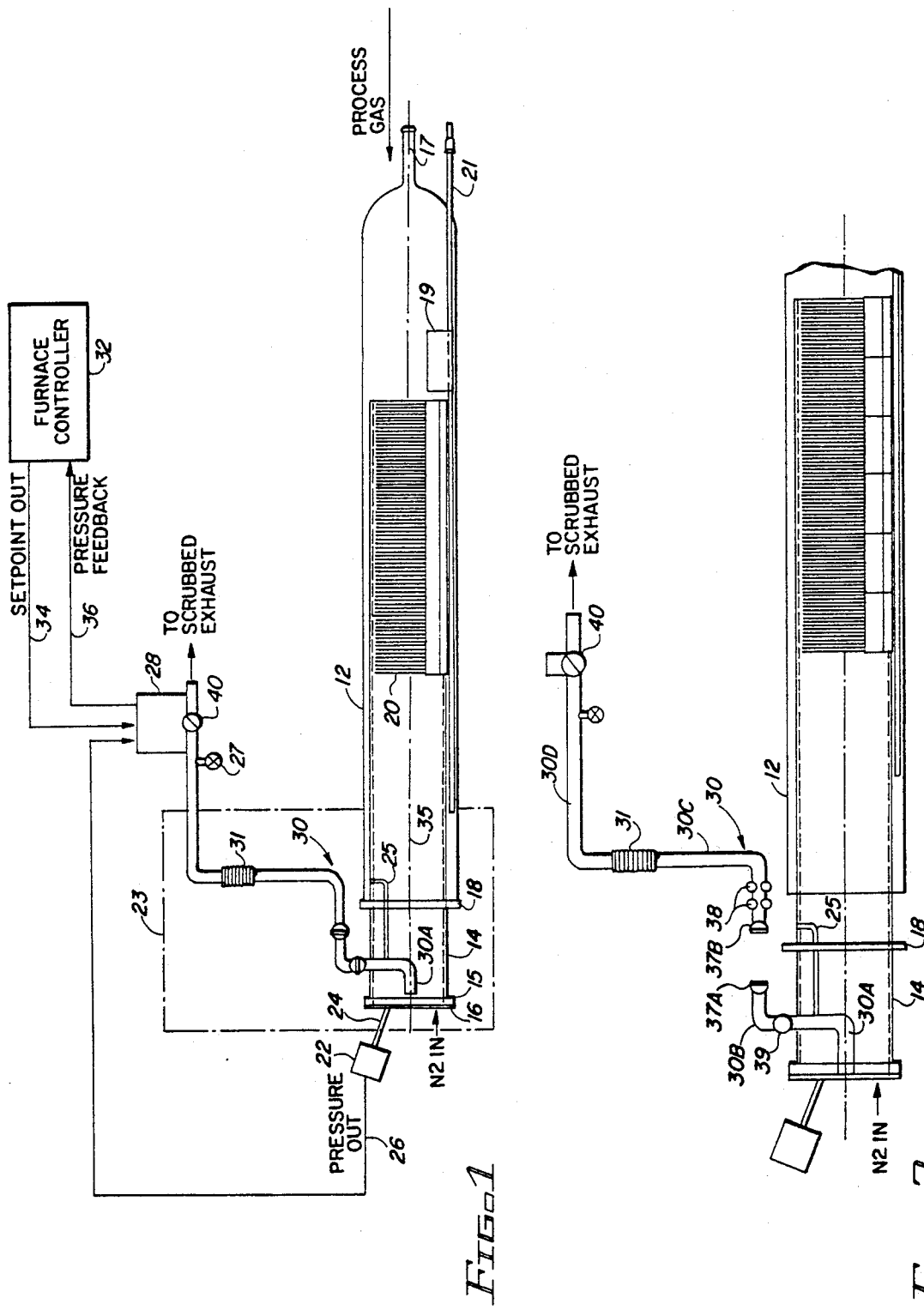

CLOSED LOOP METHOD AND APPARATUS FOR PREVENTING EXHAUSTED REACTANT GAS FROM MIXING WITH AMBIENT AIR AND ENHANCING REPEATABILITY OF REACTION GAS RESULTS ON WAFERS

BACKGROUND OF THE INVENTION

The invention relates to methods and apparatus for preventing exhausted reactant gas from mixing with ambient air of a semiconductor wafer fabrication facility and thereby reducing corrosion of "scavenger boxes" in the semiconductor wafer fabrication facility, improving the safety for employees, and improving the uniformity and/or repeatability of semiconductor wafer processing reactions within reaction chambers or furnaces.

Most furnace processing operations in the semiconductor industry are performed at or near ambient atmospheric pressure and are affected by changes in exhaust pressure. However, exhaust pressure varies considerably due to a wide range of factors, including demands made on the exhaust system by other pieces of equipment coupled into the exhaust network, changes in processes from tube to tube within the furnace, and changes in the process occurring within the tube. In some cases, the amount of scavenger exhaust draw required in order to prevent toxic or corrosive gases from escaping the scavenger is so high that the process is adversely affected, even if the exhaust pressure is unchanging. These changes in exhaust pressure result in variations in the gas flow pattern of process gas flowing through wafers such as 20 in FIG. 1. These gas flow variations result in non-uniformities and, more importantly, in non-repeatability in the process reaction results on the wafers. This in turn results in reduction in wafer yield, which can be very expensive.

The above mentioned "scavenging systems" in the semiconductor industry usually include rectangular metal inlets, roughly 12 inches square, into which spent reaction gasses are drawn and routed to the exhaust "scrubber" system of the wafer fabrication facility. The toxic gasses usually cause corrosion of the scavenger boxes and nearby electrical and mechanical components. The corrosion generates airborne particulate which are very undesirable in a semiconductor processing facility in which the air should be ultraclean.

The health of operators and employees also maybe affected by any spent reactant gases which escape the scavenger and flow into the air of wafer fabrication facility (often referred to simply as the "fab").

Low pressure chemical vapor deposition (LPCVD) systems are known in which gas pressures in wafer processing chambers are nearer to a perfect vacuum; the pressures in LPCVD systems often are in the range from 0.1 to 100 torr. Commercially available absolute pressure sensors having a full scale reading of 0–1, 0–10, or 0–100 torr are used to measure pressure in an LPCVD system. The low pressure is measured and precisely regulated to within approximately 0.5 percent of the full scale value by comparing the measured pressure with a preset device pressure value and controlling the operation of a vacuum pump connected to an outlet port similar to 17 in FIG. 1. Uniformity of processing results produced on the wafers in LPCVD systems, and the repeatability of such results is acceptable, but deposited films such as oxide films vary from system to system, and are subject to pinholes and voids within the deposited film. Conventional LPCVD systems have various disadvantages, including having very slow wafer throughput, requiring very expensive vacuum hardware which is difficult and expensive to maintain, tending to generate excessive particulate, and requiring relatively large spacing between wafers.

Other prior art systems, referred to as high pressure systems, are known in which the semiconductor processing steps, such as oxide growth, are performed at very high pressures, for example 10–25 atmospheres, in order to greatly increase deposition rates or to lower the reaction temperatures. Such high pressure reaction systems usually are used to grow thick "field" oxides. Ordinarily, the thickness of a field oxide is easy to make uniform, so the pressure control systems utilized to maintain the high pressure at a particular value (for example 10 atmospheres) inside the reaction chamber do not provide high precision pressure regulation.

For approximately about the last 30 years, the vast majority of all semiconductor wafer processing operations in closed reaction chambers have been performed at or very close to ambient atmospheric pressure. No one has attempted to precisely control pressure in such atmospheric pressure reaction chambers, despite the non-repeatability and non-uniformity caused by the above mentioned well known variations in exhaust conditions. Perhaps an important reason that no furnace manufacturers have provided a solution to these problems is the difficulty in obtaining equipment capable of accurately measuring absolute pressure to the required accuracy, as is done in the above mentioned LPCVD systems. Furthermore, demand for higher uniformity and more dense circuitry means tighter control of process parameters is required.

Ways of preventing corrosion of the above mentioned scavenger boxes have included running an exhaust tube directly from the reaction gas outlet of the reactor tube directly through the scavenger box into the scrubber inlet, diluting gases in the scavenger, and providing various mechanical barriers. Use of exhaust gas tubes has been found to cause severe problems with wafer processing uniformity and/or repeatability when cantilever tubes of the type described in the assignee's ATMOSCAN system (described in U.S. Pat. No. 4,526,534 "cantilever diffusion tube apparatus and method", issued Jul. 2, 1985 to Wollmann, and U.S. Pat. No. 4,543,059 "slotted cantilever diffusion tube system and method and apparatus for loading", issued on Sept. 24, 1985 to Whang et al, both incorporated herein by reference) are utilized. Dilution gases and barrier methods do not adequately protect the process from variations in exhaust draw.

Toxic exhausted reactant gases, even at low concentrations, are a health hazard and cause discomfort to furnace operators. Therefore, in present wafer fabrication facilities, exhaust flow rates are set at high levels to insure that gases in the scavenger area are drawn into the exhaust system. Such high exhaust gas flow rates or suction levels sometimes deleteriously affect wafer processing results.

Until now there has been an unmet need for providing an apparatus and technique for separating exhaust effluent without subjecting the process tube to effects of exhaust pressure variation, and improving the uniformity and/or repeatability of semiconductor wafer processing reactions performed at approximately atmospheric pressure. There also has been an unmet need for an apparatus and technique for preventing corrosion of scavenger boxes and releasing toxic gases in semiconductor wafer fabrication facilities without causing problems in the uniformity of semiconductor wafer reaction results and/or the repeatability thereof.

SUMMARY OF THE INVENTION

Accordingly, it is an object of the invention to provide an improved apparatus and method for reducing corrosion in scavenger boxes and reducing escape of toxic gases into semiconductor wafer fabrication facilities.

It is another object of the present invention to provide an improved apparatus and method for preventing mixing of spent reactant gases with ambient air in a wafer fabrication facility.

It is another object of the invention to provide an improved apparatus and method for improving the uniformity and/or repeatability of semiconductor wafer processing reactions at atmospheric pressure in known semiconductor processing reaction chambers.

It is another object of the invention to provide a method and apparatus for preventing corrosion in scavenger boxes and in nearby electrical and mechanical equipment in semiconductor wafer fabrication facilities while also enhancing the uniformity and/or repeatability of semiconductor wafer processing reaction results on wafers within the furnace tubes, the spent gas outlets of which are coupled to the scavenger boxes.

It is another object of the invention to improve employee safety and comfort in a semiconductor wafer fabrication facility.

Briefly described, and in accordance with one embodiment thereof the invention provides a method and apparatus for operating a semiconductor wafer processing furnace by placing a plurality of wafers in a reactor tube in a hot zone of the furnace and moving reaction gas through the reactor tube and between the wafers therein. One inlet of an exhaust gas tube is located at a point downstream from the wafers in the reactor tube, resulting in a uniform, repeatable reactant gas flow pattern through the wafers. The spent reaction gas is moved into the inlet of the exhaust gas tube, through the exhaust gas tube and an exhaust valve connected thereto, and into an exhaust gas scrubber system. The total gas pressure in the reaction tube near the inlet of the exhaust tube is measured relative to ambient atmospheric pressure by means of a differential manometer to produce a pressure-indicating signal representative of the measured pressure. The flow of spent reactant gasses in the exhaust tube is controlled by comparing the pressure-indicating signal to a preset signal indicative of a preselected desired constant pressure to produce an error signal. The degree to which the exhaust valve is open is automatically controlled in response to the magnitude of the error signal. The exhaust tube passes through a scavenger box into the scrubber inlet, to thereby avoid corrosion of the scavenger box and other nearby electrical and mechanical components by spent reactor gas. Precise control of the measured pressure in the reactor tube results in a high degree of repeatability of reaction gas results on the wafers despite variations in the exhaust system pressure and despite variations in the furnace exhaust from tube to tube. In the described embodiment of the invention, the reactor tube is a horizontal cantilever tube horizontally moveable into and out of a fixed furnace tube and carrying the wafers to a "hot zone" of the furnace. However, the invention applies equally to any atmospheric process chamber, regardless of whether it is horizontal and regardless of whether the reactor tube is a cantilever tube. The differential manometer and control circuitry receiving the pressure-indicating signal therefrom coact to control the measured pressure in the cantilever reactor tube with an accuracy of approximately 0.01 torr above ambient atmospheric pressure.

BRIEF DESCRIPTION OF THE DRAWINGS

FIG. 1 is a diagram of the closed loop atmospheric pressure control system of the present invention.

FIG. 2 is an enlarged diagram of the apparatus of a portion of the apparatus in FIG. 1 useful in explaining the operation of the invention.

DETAILED DESCRIPTION OF THE PREFERRED EMBODIMENTS

Referring to FIG. 1, a conventional process tube 12 is shown. A cantilever diffusion tube 14 moves horizontally in and out of process tube 12. Cantilever tube 14 is supported on a horizontal track by a moveable trolley (not shown), while process tube 12 is in a fixed location in a furnace assembly. Cantilever diffusion tube 14 includes an end flange 15 by means of which it is clamped to the trolley. A "door plate" 16 covers the left end of cantilever diffusion tube 14 by forming a seal with flange 15. Cantilever tube 14 includes a second flange 18 which abuts and forms a seal with the mouth of furnace tube 12.

A plurality of semiconductor wafers 20 are supported in "boats" in the right end of cantilever tube 14 in the "hot zone" of the furnace. Process reaction gas enters inlet 17 of process tube 12, flows into the open right end of cantilever tube 14 between wafers 20, through left end portion of cantilever diffusion tube 14, and finally is exhausted through an exhaust tube 30. Exhaust tube 30 extends through the wall of cantilever tube 14 and has an inlet 30A aligned with center axis 35 and located adjacent to (approximately 0.12 inches from) door plate 16. Exhaust tube 30 passes upward into an INCONEL bellows 31 and into the "scavenger" area indicated by dotted line 23. An automatically controlled throttle valve 40 is in the path of exhaust tube 30 and is connected to the suction inlet of an exhaust "scrubber" system (not shown).

In accordance with the present invention, the pressure inside fixed furnace tube 12 and cantilever tube 14 is maintained close to the ambient atmospheric pressure. The pressure is primarily measured by a differential manometer 22, which references the pressure at approximately 2.5 inches from the location of exhaust tube inlet section 30A to ambient outside atmospheric pressure and generates a corresponding pressure-indicating signal on conductor 26, which is connected to an input of a throttle valve control system 28. A furnace control system 32 receives a pressure feedback signal 36 from control system 28, and provides a predetermined set point signal 34 to the valve control system to precisely control throttle valve 40 and thereby control the flow of exhaust gas in exhaust line 30 and thereby control the pressure in cantilever tube adjacent to inlet section 30A of exhaust tube 30.

Bypass tube 25 in FIGS. 1 and 2 allows gas between the outer wall of cantilever tube 14 and the inner wall of furnace tube 12 to flow into exhaust tube assembly 30. By precisely controlling the extent to which valve 40 is opened in response to pressure-indicating signal 26, the pressure just inside cantilever tube 14 adjacent to exhaust tube inlet 30A measured by differential manometer 22 is maintained very precisely constant, within perhaps 0.04 torr ±0.01 torr above ambient atmospheric pressure. This level of accuracy has never been achieved before in an ambient pressure semiconductor wafer reaction chamber.

Dotted line 23 indicates the general location of the scavenger area in which it is an object of the invention to avoid corrosion due to toxic gasses exhausted from the process chamber (i.e., cantilever tube 14). (Numeral 19 designates a conventional gas baffle, which need not be described; numeral 21 shows a conventional thermocouple.)

Control circuit 28 associated with stepper-motor controlled throttle valve 40 contains electronics which receive the pressure-indicating signal 26 from differential manometer 22 and compares that signal to a "set point" output signal 34 produced by system controller 32 and accordingly opens throttle valve 40 sufficiently and for a duration of time required to allow the pressure measured by manometer 22 to attain the pressure represented by the set point output signal 34. The set point is programmed by a furnace operator into the furnace controller software executed by furnace controller 32. The signal 36 corresponds to the pressure output signal 26 produced by manometer 22 and controls a pressure read-out element in controller 32.

In FIG. 1. an INCONEL bellows assembly 31,30C is located inside the scavenger area 23. FIG. 2 shows the details more clearly, with cantilever totally withdrawn slightly. The bellows assembly 31 is spring actuated to insure a positive seal between a ball 37A and socket 37B and is supported by INCONEL rollers 38 and several brackets (not shown) which provide three-axis adjustment. The ball 37A sits within the socket 37B on the bellows assembly 31,30C during wafer processing. Ball and socket assembly 39 connects quartz elbow 30B to exhaust inlet section 30A.

The foregoing ball and socket arrangement allows for a positive seal of the exhaust elbow and bellows while also providing a mechanical separation point so that the cantilever tube 14 can be withdrawn from the furnace without any operator intervention to disconnect the exhaust plumbing.

Differential manometer 22, which can be an INCONEL body capacitance manometer, is mounted behind the assembly supporting cantilever tube 14 and is attached to door plate 16. This arrangement allows the manometer 22 to directly sense the pressure adjacent to the open end of tube section 30A. Differential manometer 22 can be a model 225AD available from MKS Instruments, and has a full scale reading of 1.00 Torr above atmospheric pressure.

Control valve 40 is a stepper-motor-driven throttle valve with a Teflon (TFE) coated stainless steel throat. Throttle valve 40 is located behind the scavenger box in scavenger area 23 and controls exhaust pressure in cantilever 14. A small drain valve 27 is provided just before valve 40 to drain any condensation from exhaust tube 30.

The electronic controller 28 included inside the valve head controls the degree to which valve 40 is open or closed. System controller 32, which can be a model TMX10000 available from Thermco Systems, Inc., receives signals 36 from the valve controller circuitry 28 via a mass flow controller channel from manometer 22 along conductor 26. These signals are compared to provide a pressure feedback error signal within block 28. The error signal is used to control valve 40 in a manner similar to the pressure control in the above mentioned low pressure CVD systems of the prior art.

Good seals must be maintained between door plate 16 and flange 15 and between flange 18 of cantilever tube 14 in the mouth of process tube 12. However, the present invention allows more variation in the seal integrity, because process pressure now is controlled by valve 40 and controller 28 rather than being dependent on seal integrity, exhaust pressure etc. Leaks around the above mentioned ball socket and in the connection to tube 24 should be prevented. Exhausting of gas between the outer wall of cantilever tube 14 and the inner wall of furnace tube 12 through bypass tube 25 reduces the effect of slight leakage through the seal between flange 18 and the mouth of furnace tube 12.

The above described system provides a direct path from cantilever tube 14 to the exhaust scrubber inlet of the semiconductor fabrication facility, and reduces process effluent in the scavenger area 23. The described system also provides very good control of pressure inside cantilever diffusion tube 14 despite (1) variations in the volume of gas flow in diffusion cantilever tube 14, (2) variations in level of pressure in the quartz elbow 30 and the tubing associated therewith, (3) variations in the seal between the flange 18 of cantilever tube 14 and the mouth of process tube 12, (4) variations in any of the other above mentioned possible leaks in the exhaust system, and (5) changes in the process tube temperature. Providing a closed loop controller in the pressure system compensates for variations in the above factors to provide steady measured pressure in the 0.04 to 0.10 torr above ambient atmospheric pressure.

It should be noted that in accordance with the present invention, the point at which differential manometer 22 measures pressure inside cantilever tube 14 is located close to the opening of exhaust tube section 30A, which in turn is located close to or on center axis 35. In accordance with known practice, this location of exhaust tube inlet section 30A is used to minimize undesirable variations in process gas flow pattern through wafers 20. Different reactor tubes and wafer boats will require different placement of the wafers relative to the center axis of such reactor tubes. Different dimensional tolerances between wafers, wafer edges, and the inside walls of the reactor tubes will result in different reaction gas flow patterns which in turn affect uniformity and repeatability of processing reaction effects on the wafers. Placement of the exhaust tube inlet within the reactor tube at a location that minimizes variations in the gas flow patterns and measurement of the pressure within the reactor near that location is very important to achieving the objective of obtaining repeatability and/or uniformity of wafer processing reaction results on the wafers 20 using the system of FIG. 1. While the invention has been described with reference to several embodiments thereof, those skilled in the art will be able to make various modifications to the described embodiments without departing from the true spirit and scope of the invention. For example, instead of controlling a throttle valve such as 40 in the exhaust tube assembly 30, the flow of an inert gas injected into exhaust tube assembly 30 could be controlled in response to the pressure indicating signal 26 to produce the same result as controlling valve 40. The principles of the invention can be applied to open cantilever systems, so-called "white elephant" systems, and vertical reactor systems. The pressure in cantilever tube 14 could be measured elsewhere therein than at the point shown in the drawings. For example, the pressure could be measured in the vicinity of the wafers.

What is claimed is:

1. A method of operating a semiconductor wafer processing furnace comprising the steps of:
   a. placing a plurality of wafers in a reactor chamber associated with the furnace;
   b. moving reaction gas through the reactor chamber and between the wafers in the reactor chamber;
   c. placing an inlet of an exhaust tube at a location in the reactor chamber that results in a repeatable gas flow pattern through the wafers;
   d. moving spent reaction gas into the inlet of the exhaust tube and through the exhaust tube and an exhaust valve into an exhaust scrubber system;
   e. measuring gas pressure in the reactor chamber at a location near the inlet of the exhaust tube by means of a differential manometer that precisely references the measured gas pressure to ambient atmospheric pressure and producing a pressure-indicating signal representative of the measured gas pressure; and
   f. controlling the exhaust valve in response to the pressure-indicating signal to cause the measured gas pressure to have a preselected constant value.

2. The method of claim 1 wherein step (f) includes comparing the pressure-indicating signal to a signal indicative of the preselected constant value and producing an error signal, and controlling the degree to which the exhaust valve is open in response to the error signal.

3. The method of claim 2 including passing the exhaust tube through a scavenger box, whereby corrosion of the scavenger box by spent reaction gas is avoided, and repeatability of results of the reaction gas on the wafers is improved by maintaining the measured gas pressure constant despite variations in ambient atmospheric pressure and despite variations in pressure in an exhaust gas scrubber system receiving spent reaction gas from the exhaust tube.

4. The method of claim 3 wherein the reactor chamber includes a horizontal cantilever reactor tube horizontally moveable into and out of a fixed furnace tube, step (a) including placing the wafers in the cantilever reactor tube and then moving the cantilever reactor tube into the furnace tube in sealed relationship thereto.

5. The method of claim 2 wherein step (f) includes controlling the exhaust valve with sufficient precision to control the measured pressure to within approximately 0.01 torr of ambient atmospheric pressure.

6. A method of operating a semiconductor wafer processing furnace system comprising the steps of:
   a. placing at least one wafer in a reactor chamber associated with the furnace;
   b. moving reaction gas through the reactor chamber and around the wafer in the reactor chamber;
   c. placing an inlet of an exhaust tube at a location in the reactor chamber that results in a repeatable gas flow pattern around the wafer;
   d. moving spent reaction gas into the inlet of the exhaust tube and through the exhaust tube into an exhaust scrubber system;
   e. measuring gas pressure at a predetermined location in the reactor chamber by means of a differential manometer that precisely references the measured gas pressure to ambient atmospheric pressure and producing a pressure-indicating signal representative of the measured gas pressure; and
   f. controlling flow of the spent reaction gas through the exhaust tube in response to the pressure-indicating signal to cause the measured gas pressure to have a preselected constant value.

7. A system for operating a semiconductor wafer processing furnace, comprising in combination:
   a. reactor chamber associated with the furnace for holding at lease one wafer;
   b. means for moving reaction gas through the reactor chamber and around the wafers in the reactor chamber;
   c. an exhaust tube having an inlet at a location inside the reactor chamber that results in a repeatable gas flow pattern around the wafer, the exhaust tube passing through a wall of the reactor chamber;
   d. means for moving spent reaction gas into the inlet of the exhaust tube and through the exhaust tube into an exhaust scrubber system;
   e. a differential manometer connected to measure gas pressure in the reactor chamber at a predetermined location in the reactor chamber, the differential manometer precisely referencing the measured gas pressure to ambient atmospheric pressure and producing a pressure-indicating signal representative of the measured gas pressure; and
   f. means for controlling the flow of spent reaction gas through the exhaust tube in response to the pressure-indicating signal to cause the measured gas pressure to have a preselected constant value.

8. The system of claim 7 including means for comparing the pressure-indicating signal to a signal indicative of the preselected constant value and producing an error signal, and controlling the flow of the spent reaction gas in response to the error signal, whereby corrosion of a scavenger box by spent reaction gas is avoided, and repeatability of results of the reaction gas on the wafers is improved by maintaining the measured gas pressure constant despite variations in ambient atmospheric pressure and despite variations in pressure in an exhaust gas scrubber receiving the spent reaction gas from the exhaust tube.

9. The system of claim 8 wherein the reactor chamber includes a horizontal cantilever reactor tube horizontally moveable into and out of a fixed furnace tube, and means for engaging the cantilever reactor tube in sealed relationship with the furnace tube.

* * * * *